METHOD OF FORMING RECTIFIER STACKS

Filed Feb. 28, 1968 2 Sheets-Sheet 1

INVENTORS
DAVID F. COSPER
JERRY R. ESTES

Arthur M. Sloan

ATTORNEY

*INVENTORS*
DAVID F. COSPER
JERRY R. ESTES
Arthur M. Sloan
ATTORNEY

United States Patent Office 3,543,393
Patented Dec. 1, 1970

3,543,393

METHOD OF FORMING RECTIFIER STACKS

David F. Cosper, Dallas, and Jerry R. Estes, Garland, Tex., assignors to Varo, Inc., Garland, Tex., a corporation of Texas Filed Feb. 28, 1968, Ser. No. 708,901
Int. Cl. B01j *17/00;* H01l *7/66*
U.S. Cl. 29—583 5 Claims

ABSTRACT OF THE DISCLOSURE

A method is disclosed for forming rectifier stacks in which thin wafers of silicon, each of which has a P-N junction formed therein, are dipped in a soft solder to wet the surface of the wafer. Subsequently, a desired number of the wafers are stacked together and placed in a furnace having an inert atmosphere. The stacks of wafers are heated under a vacuum to fuse the wafers together without voids or air pockets between the wafers. The stacks of wafers are then cut to provide stacks of semiconductor die of the desired junction area.

Recent years have seen the advent of many solid state elements in such appliances as television and radio. Television though has been one of the last appliances in which solid state devices fully replace gas or vacuum tubes. This is due in part to the fact that extremely high voltages are developed across certain parts of the circuit, especially in color television sets. One element in particular that has been expensive and difficult to produce in the solid state form is the high voltage rectifier commonly used with the fly back transformer. In normal operation this element must be able to withstand a peak inverse voltage in the order of 35,000 volts or higher applied across its terminals.

It is known that solid state silicon rectifiers are not individually able to withstand this type of voltage, but that a plurality of individual rectifiers can be connected in series to form a rectifier stack capable of withstanding the extremely high peak inverse voltage without an excessively high forward voltage drop. For example, if a voltage of 35,000 volts is applied across a stack of 35 individual rectifiers the junction in each of the rectifiers is subjected to a potentail of only 1,000 volts. This solution seems simple enough but unfortunately the stacked silicon rectifiers are very difficut to produce, and are quite expensive because of the high rejection rate if conventional manufacturing processes are used in their manufacture.

The major problem in producing rectifier stacks has been reliably bonding the individual chips of rectifier material together to form the stack. It is an expensive and time consuming operation to connect a plurality of individual rectifiers by conventional connection elements. Attempts to form stacks of wafers from which stacks of rectifiers are cut have not met with substantial success as most often tiny voids or pockets of air or impurities may form between adjacent pairs of wafers as they are bonded together. A rectifier stack cut from the particular area of the stack of wafers will be defective. As there may be as many as 30 layers of wafers from which the rectifier stack is obtained, the chances of having a void or poor connections between the bonded die at some point in the stack are greatly multipled. This problem is aggravated by the extremely small size of the individual die making up the stack, as even a small void can cause a point of high current density or a complete open circuit. It will be appreciated that the contact area between individual die forming the rectifier stack is suitably square and in the order of 15 to 50 mils on a side. Several hundred to one thousand rectifier stacks can be cut from a single stack formed of wafers about 1¼ inch in diameter.

The present invention provides an improved method of forming rectifier stacks. Wafers of semiconductor material are prepared by conventional methods. The processing of the wafers includes formation of a P-N junction of the desired character therein followed by plating and sintering of the wafers. The wafers could be cut into dies suitable for use in individual rectifiers if desired. Each wafer is then coated with soft solder after having been thoroughly cleaned and coated with a soldering flux. It is important that the entire surface of each wafer be wetted by the solder. The wafers are then cleaned again to remove any remaining flux or any impurities and stacked together under pressure. The stacks of wafers are heated while subjected to a vacuum in a furnace having an inert atmosphere to cause the wafers to fuse together forming a unitized stack. Heating is then stopped and the inert gas is caused to flow over the stack at substantial pressure to promote rapid cooling of the stacks and minimize the size of voids. The unitized stacks of wafers may then be cut into a number of the desired rectifier stacks.

Many objects and advantages of the invention defined in the appended claims will become readily apparent to persons skilled in the art as a detailed description of a preferred embodiment of the invention unfolds when taken in conjunction with the accompanying drawing wherein like reference numerals denote like parts and in which:

Figure 1:
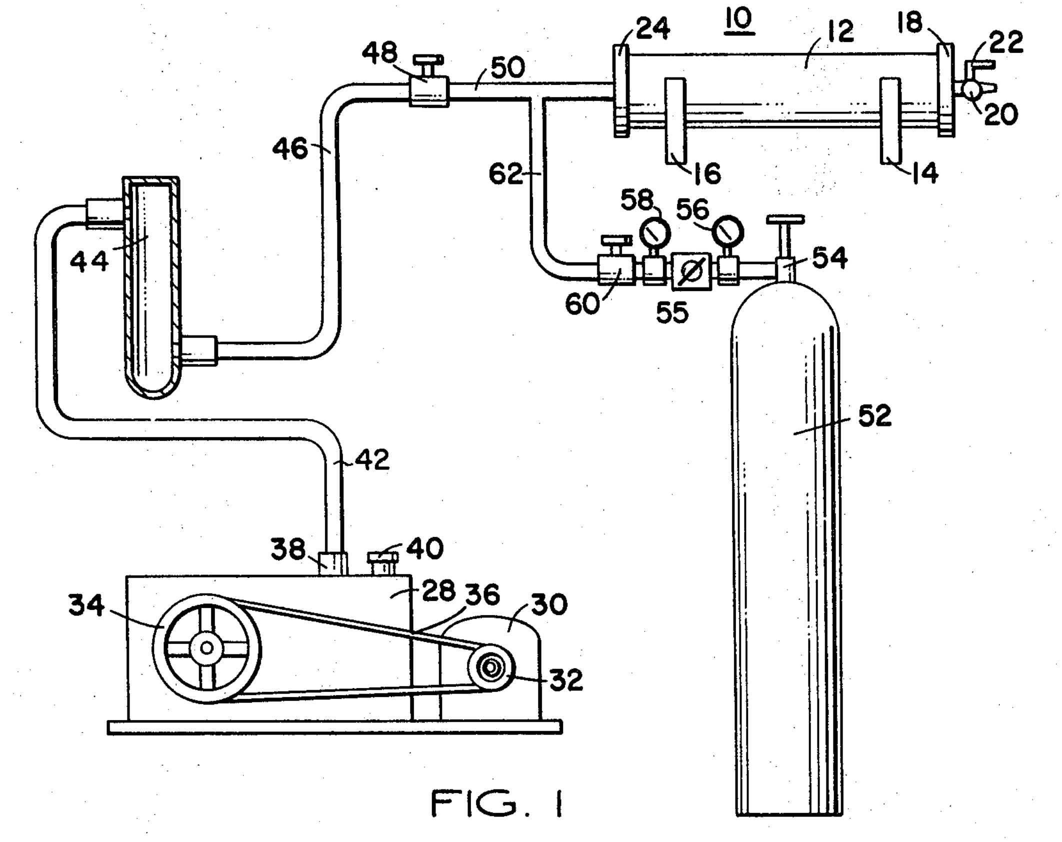
FIG. 1 is a schematic diagram illustrating a suitable furnace for fusing together a stack of semiconductor slices with accompanying means for evacuating the furnace and providing an inert atmosphere.

FIG. 1 of the drawings shows a furnace 10 comprising a cylindrical housing 12 carried by a pair of supports 14 and 16 for mounting on a table or directly on the floor. The back of the housing 12 is sealed with an end cap 18 through which protrudes a pressure releasing valve 20 with means 22 thereon for opening and closing the valve. The front of the housing 12 is sealed with a removable cap 24 which may be removed for placing material in the furnace. Suitable but conventional means are also provided, though not shown, for heating the furnace and for controlling the temperature thereof.

A vacuum pump 28, driven by motor 30 through pulleys 32 and 34 and belt 36, is provided for evacuating the furance to provide a vacuum. The pump suitably includes an inlet port 38 and an outlet port 40. A pipe 42 connects the inlet port 38 through a cold trap 44 to the furnace 10. The cold trap is suitably made of glass and during operation of the device is filled with a liquified gas, suitably nitrogen, for aiding in the removal of gas from the furnace. A valve 48 is connected between the cold trap 44 and the furnace 10 for controlling the vacuum within the furnace. Conduits 46 and 50 connect the valve to the cold trap 44 and the furnace 10, respectively.

A source of inert gas such as argon is provided as in a container 52 for cooling the stacks of fused wafers after heating and for purging the furnace of air to provide an inert atmosphere therein prior to evacuating the furnace to provide the desired vacuum. The container 52 includes a main shut off valve 54. Valve 54 is connected through pressure regulator 55, valve 60 and conduit 62 to conduit 50 and thus to the furnace. Pressure regulator 55 and control valve 60 control the flow of the inert gas into the furnace. Gauges 56 and 58 are provided for showing the tank pressure and the line pressure respectively. Valve 60 is preferably a plug valve which can be adjusted rapidly. It will be noted that operation of valve 60 will not affect the regulator 55.

Figure 2:
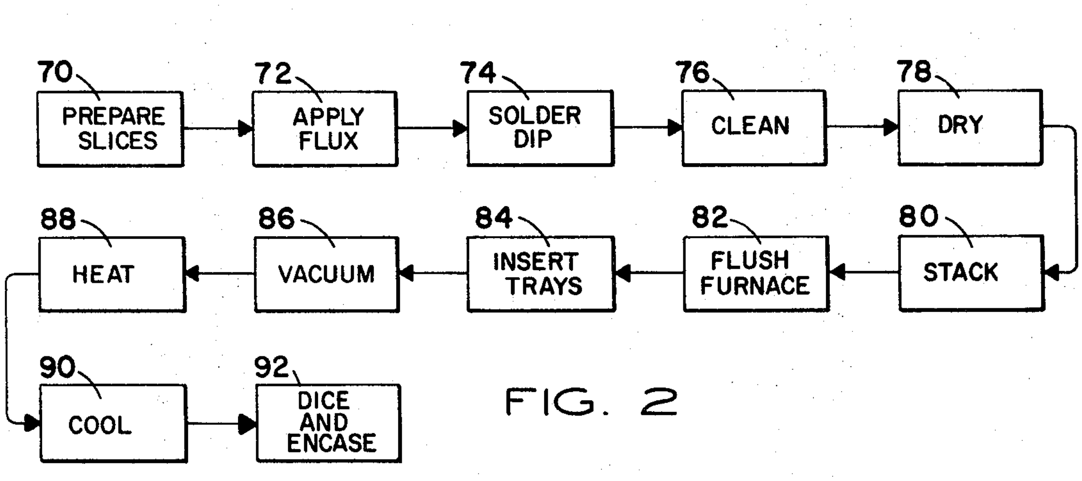
FIG. 2 is a flow diagram showing the steps employed in a preferred embodiment of the present invention.

A preferred embodiment of the method of the present invention will now be described. As shown in FIG. 2 of the drawings, the slices of silicon or other semiconductor material are initially prepared by forming a P–N junction of the desired character in each of the slices and then plating the slices, as shown schematically at numeral 70. The P–N junctions are suitably formed by conventional diffusion processes well known in the art, and accordingly, a detailed description thereof will not be given. Plating and sintering steps are also well known in the art and detailed description thereof is not necessary to an understanding of the invention.

Next, as shown schematically at numeral 72, a suitable soldering flux is applied to the entire surface of each slice of semiconductor material. This step is preferably accomplished by dipping each slice into a container of the flux and wiping off excess flux with an absorbent towel. It is desirable that the entire surface of each slice be coated with flux to promote wetting of the entire surface by the soft solder.

Soft solder is then applied over the entire surface of each wafer as indicated at 74. This is preferably accomplished by dipping the wafers into a container of molten soft solder. The term "soft solder" as used herein means a lead or tin base solder. A lead base solder is preferred as it is more etch resistant than a tin base solder. The preferred solder is a lead-tin-sliver eutectic having a melting point of 308° C. and comprising 97½% lead, 1½% tin, and 1% silver. It is preferred that the solder include tin and silver in addition to the lead base to improve its wetting chracteristics. Again it is most important that the solder wet the entire surface of each wafer to insure that voids will not be produced when the stack of wafers are bonded together. It may be required that the wafers be dipped more than once to insure a complete and uniform coating of solder.

The wafers coated with soft solder are then thorougly cleaned to remove any remaining flux therefrom as shown at 76. This may be done by dipping or rinsing the wafers in flux remover followed by rinsing in a acetone or other suitable solvent. Next, the individual wafers are thoroughly dried as shown at 78 to remove any excess flux or oxides that may remain on the surface of a wafer. This can readily be accomplished by swabbing both sides of the slices with cotton swabs and acetone and placing the slices on an absorbent paper surface to dry. Cleaning and drying are very important as it is desired that no material which will vaporize or outgas when the wafers are fused be present as bubbles formed thereby will often result in voids. Oxides present on the surface will, of course, impair the bonding together of adjacent slices.

Figure 3:
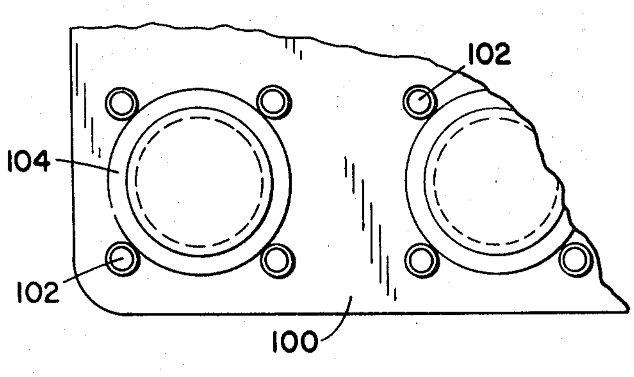
FIG. 3 is a plan view, partially broken away, of stacks of wafers of semiconductor material on a tray in preparation for heating in the furnace.
Figure 4:
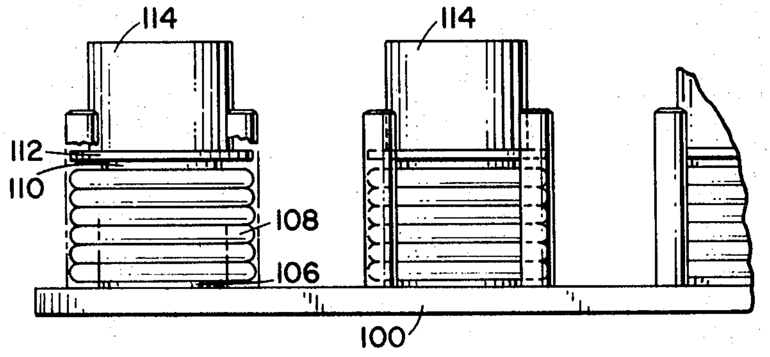
FIG. 4 is a side elevational view of stacks of semiconductor wafers and the tray as shown in FIG. 3.

A desired number of the solder coated wafers are then stacked one on another in preparation for inserting in the heating furnace. As shown in FIGS. 3 and 4, the desired number of wafers may be stacked on a graphite tray 100. The tray 100 includes a number of graphite rods 102 protruding upwardly therefrom and arranged as forms for the stack of wafers 104. As shown in FIG. 4, the wafers are stacked by first placing a solder pre-form 106 on the graphite tray and then stacking a predetermined number of slices 108 on the trap. Only six slices are shown in FIG. 4, although in some instances as many as thirty slices or more will be required. Another solder pre-form 110 is placed on top of the uppermost slice. The solder pre-forms 106 and 110 serve to provide a thicker layer of solder on the top and bottom of the stacks of wafers to facilitate attaching contacts to the completed rectifier stacks. A graphite spacer 112 is placed on top of the solder pre-form 110 and a weight 114 is placed on top of the stack of slices for pressing the slices together to further aid in providing a void free bond between contiguous slices. The amount of weight used should be sufficient to provide the desired thickness of solder between slices but not to cause excessive flow of solder from between the slices. For a stack of 1¼ inches in diameter for example, a weight of 125 grams has been found to produce good results for stacks 2–30 slices in height.

The next step 82 in the process is to flush or purge the furnace with an inert gas, suitably argon. Referring to FIG. 1, above, it may be seen that by opening valves 54, 60, and 20, and closing valve 48, argon is caused to flow from the cylinder 52 through the conduits 60 and 50 into the furnace 10, causing air contained therein to pass out valve 20. By allowing gas in the cylinder 52 to flow through the furnace for a period of time, for example from about 5 to 10 minutes, it has been found that most of the air contained in the furnace is purged therefrom.

The trays 100 illustrated in FIGS. 3 and 4 are then placed in the furnace 10, indicated in FIG. 2 as step 84, by removing the cap 24 therefrom. The traps are placed in the furnace such that the stacks will remain in the vertical position as shown to minimize lateral flow of the solder. It is preferred that the stacks of wafers be inserted while the furnace is being purged with the inert gas.

The next step is to replace the cover 24 which is sealed by an O-ring (not shown), close the valve 20 and evacuate the furnace 10 to provide a partial vacuum therein. This is done by closing the valve 60 to turn off the purging gas contained in the cylinder 52, opening the valve 48 and turning on the motor 30 to drive the vacuum pump 28. The cold trap 44 is previously filled with a quantity of liquified gas, such as nitrogen or other cooling gas, to further aid in the removal of gas from the furnace chamber 10 by absorption. A partial vacuum of 25 to 100 microns, for example, has been found to produce suitable results.

Once the desired level of vacuum has been established in the furnace, the furnace is heated to a temperature as required to cause the wafers of semiconductor material to fuse together to form a unitized stack of semiconductor wafers as indicated in step 88. The temperature of the furnace should be raised to above the melting point of the solder to insure that the solder flows freely. In accordance with one specific example of the invention using the above described soft solder, an oven temperature of from about 380° C. to about 410° C. was used. It is important to note that the furnace is preferably one which will apply a uniform heat through the stack, rather than rely on conduction through the stack, as silicon is a relatively poor conductor of heat. The presence of the inert atmosphere minimizes oxidation of the slice surfaces and the vacuum estabilshed in the furnace minimizes the formation of void producing bubbles when the stack of wafers is heated.

After heating the stacks of semiconductor wafers are allowed to cool as indicated in step 90, permitting the solder to harden and fuse the wafers into unitized stacks. Cooling is preferably accomplished in an inert atmosphere by releasing the vacuum and permitting the inert gas to flow into the furnace over the stacks of wafers. Cooling with the pressure in the furnace greater than that present during heating minimizes the size of any bubbles present when the solder cools to the point at which it solidifies. The flow of inert gas is suitably controlled by adjustment of valves 70 and 22 after valve 48 is closed. A pressure of approximately 20 p.s.i. during cooling has been found to be sufficient.

Figure 5:
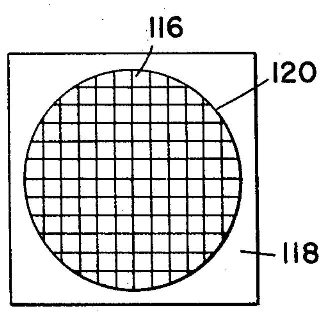
FIG. 5 is a plan view of a fused stack of wafers with lines thereon to illustrate the manner in which the stack of wafers can be cut to form the individual rectifier stacks.
Figure 6:
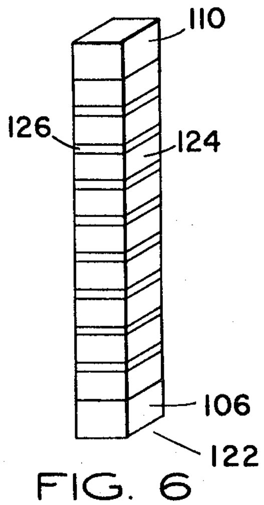
FIG. 6 is a perspective view of a rectifier stack cut from a unitized stack of wafers.

As indicated by reference character 92 of FIG. 2, after the stacks of wafers have cooled, the unitized stacks 116, as shown in the plan view of FIG. 5, are placed on a tray 118 and cut along the lines 120, as shown in FIG. 5, into the smaller stacks 122 of die as shown in FIG. 6. Each individual stack 122 comprises a number of individual semiconductor die 124 fused together by thin layers of solder 126. As previously mentioned, due to the solder pre-forms 106 and 110 disposed at the top and bottom of the stacks, the top and bottom layers of the solder are considerably thicker than the layers joining the die for providing additional material for attaching contacts to each end of the rectifier stacks thus formed. The manner of attaching leads and encasing the rectifier stack is largely a matter of choice and a detailed description will not be given as such are well known in the art.

The method just described for forming rectifier stacks provides several advantages over prior art methods. First, this method insures that a uniform wetting of the semiconductor slices by the solder is accomplished prior to fusing, insuring electrical contact to all surfaces of the wafers. The inert atmosphere provided at all times when the wafers are heated prevents oxidation of the surface of the solder and promotes a complete bond between adjacent wafers. The vacuum provided effectively removes any air bubbles which may form, minimizing the size and number of voids in the electrical contact between adjacent die in a rectifier stack. The pressure backfill applied during cooling further reduces the size of voids. Further, the use of soft solder as an electrically conductive bonding agent between adjacent die adds a certain amount of resiliency to the stacks of die, reducing breakage of the stacks of die cut from the stacks of wafers. In this connection, it will be appreciated that the length of the stacks of die is, for example, commonly six to thirty times the width thereof and that silicon is a brittle material.

Although the invention has been described with respect to a particular preferred embodiment thereof, many changes and modifications will become apparent to those skilled in the art in view of the foregoing description which is intended to be illustrative and not limiting of the invention defined in the appended claims.

What is claimed is:

1. A method of forming rectifier stacks comprising the steps of:

(a) preparing a plurality of wafers of semiconductor material including forming a rectifying junction in each of the wafers and plating each of said wafers with a conductive material;

(b) applying soldering flux to the wafers of semiconductor material;

(c) coating each of said wafers with soft solder by dipping said wafers in molten soft solder;

(d) placing said coating wafers one on top of another to form a stack;

(e) heating the stack to cause said wafers to fuse together into a unitary stack; and (f) cutting said unitary stack to form a plurality of rectifier stacks.

2. A method as defined in claim 1 wherein the stack of wafers is compressed when heated.

3. A method of soldering together individual wafers of semiconductor material to form a unitized stack of such wafers which may then be cut into a plurality of individual rectifier stacks comprising the steps of:

(a) applying a soldering flux to each individual wafer of semiconductor material to coat substantially the entire surface thereof:

(b) dipping each of said wafers of semiconductor material in molten soft solder to completely wet the entire surface of each of said wafers with said solder;

(c) after allowing said solder to set and harden, cleaning each of said wafers to remove any remaining flux and foreign matter;

(d) stacking a desired number of said wafers one on top of another on a tray in preparation for heating;

(e) pressing the stack of wafers together;

(f) heating said stack of wafers in a furnace having an inert atmosphere to a temperature in excess of the melting point of the soft solder;

(g) maintaining a partial vacuum in said furnace while said stack of wafers is heated;

(h) cooling the stack of wafers in an inert atmosphere and at a pressure substantially greater than that prevailing when the solder was heated to its melting point; and (i) cutting the stack of wafers to form stacks of die.

4. A method of forming high voltage rectifier stacks in high stacking multiples comprising the steps of: preparing a plurality of wafers of semiconductor material including forming a rectifying junction in each of the wafers and plating each of said wafers with a conductive material; coating each of said wafers with solder; placing said coated wafers one on top of another to form a stack; situating said stack of wafers in a furnace; providing an inert gaseous atmosphere in said furance and placing said atmosphere under partial vacuum; heating said stack of wafers to the fusion temperature of said solder in continuation of said partial vacuum; cooling said stack of wafers; and cutting the resultant stack to form a plurality of rectifiers.

5. The method according to claim 4 wherein said cooling is accomplished under super-atmospheric pressure.

References Cited

UNITED STATES PATENTS

| | | | |
|---|---|---|---|
| 3,274,454 | 9/1966 | Haberecht. | |
| 3,304,475 | 2/1967 | Gowen et al. | |
| 3,422,527 | 1/1969 | Gault | 29—583 X |

JOHN E. CAMPBELL, Primary Examiner

W. TUPMAN, Assistant Examiner

U.S. Cl. X.R.

29—576, 472.3, 497.5, 412